United States Patent
Haraguchi

(10) Patent No.: US 10,749,323 B2
(45) Date of Patent: Aug. 18, 2020

(54) ELECTRICAL JUNCTION BOX

(71) Applicants: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-Shi (JP)

(72) Inventor: Akira Haraguchi, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-Shi, Osaka (JP)

( * ) Notice: Subject to any disclaimer, the term of this patent is extended or adjusted under 35 U.S.C. 154(b) by 0 days.

(21) Appl. No.: 16/347,770

(22) PCT Filed: Oct. 31, 2017

(86) PCT No.: PCT/JP2017/039355
§ 371 (c)(1),
(2) Date: May 6, 2019

(87) PCT Pub. No.: WO2018/088275
PCT Pub. Date: May 17, 2018

(65) Prior Publication Data
US 2019/0319440 A1  Oct. 17, 2019

(30) Foreign Application Priority Data
Nov. 14, 2016 (JP) .................. 2016-221587

(51) Int. Cl.
*H02G 3/16* (2006.01)
*B60R 16/023* (2006.01)
(Continued)

(52) U.S. Cl.
CPC ........... *H02G 3/16* (2013.01); *B60R 16/0238* (2013.01); *H02G 5/06* (2013.01); *H03K 17/687* (2013.01);
(Continued)

(58) Field of Classification Search
CPC ........ H02G 3/16; H02G 5/06; B60R 16/0238; H03K 17/687; H05K 1/18; H05K 7/1427; H05K 7/2039
See application file for complete search history.

(56) References Cited

U.S. PATENT DOCUMENTS 3,225,820 A * 12/1965 Riordan ................. G05D 23/01
165/96
3,957,107 A * 5/1976 Altoz ...................... F28D 15/06
165/276
(Continued)

FOREIGN PATENT DOCUMENTS

JP   H7-298449 A    11/1995
JP   2000-244137 A   9/2000
JP   2015-216802 A  12/2015

OTHER PUBLICATIONS

International Search Report, Application No. PCT/JP2017/039355, dated Dec. 5, 2017. ISA/Japan Patent Office.

*Primary Examiner* — James Wu
*Assistant Examiner* — Hung Q Dang
(74) *Attorney, Agent, or Firm* — Honigman LLP

(57) ABSTRACT

Provided is an electrical junction box in which it is possible to prevent a switching element from catching fire. An electrical junction box according to one aspect of the present disclosure is an electrical junction box including: a circuit substrate on which a switching element is mounted on one side of the circuit substrate; and a housing member that houses the circuit substrate. The housing member further houses a thermally expandable expansion material member.

(Continued)

When the temperature of the switching element is low, the expansion material member is spaced apart from the circuit substrate and the switching element, and is disposed at a position opposing the one side. When the temperature of the switching element is high, the switching element is embedded in the thermally expanded expansion material member.

6 Claims, 4 Drawing Sheets

(51) Int. Cl.
*H02G 5/06* (2006.01)
*H03K 17/687* (2006.01)
*H05K 1/18* (2006.01)
*H05K 7/14* (2006.01)
*H05K 7/20* (2006.01)

(52) U.S. Cl.
CPC ............. *H05K 1/18* (2013.01); *H05K 7/1427* (2013.01); *H05K 7/2039* (2013.01)

(56) References Cited

U.S. PATENT DOCUMENTS

| | | | |
|---|---|---|---|
| 8,270,170 B2 * | 9/2012 | Hughes | H05K 7/20445 165/104.33 |
| 10,004,160 B1 * | 6/2018 | Gong | H05K 7/20454 |
| 10,292,307 B1 * | 5/2019 | Wyland | H01L 23/36 |
| 2008/0101016 A1 * | 5/2008 | Brooks | G06F 1/20 361/690 |
| 2010/0186938 A1 * | 7/2010 | Murata | C09K 5/14 165/185 |
| 2016/0165748 A1 * | 6/2016 | Chen | B23P 15/26 165/46 |
| 2018/0034169 A1 | 2/2018 | Haraguchi | |

* cited by examiner

ELECTRICAL JUNCTION BOX

CROSS-REFERENCE TO RELATED APPLICATIONS

This application is the U.S. national stage of PCT/JP2017/039355 filed Oct. 31, 2017, which claims priority of Japanese Patent Application No. JP 2016-221587 filed Nov. 14, 2016, the contents of which are incorporated herein.

TECHNICAL FIELD

The present disclosure relates to an electrical junction box.

BACKGROUND

In a vehicle, for example, an electrical junction box may be provided in an electric circuit that connects a power supply and a load, the electrical junction box including: a circuit substrate on which a switching element and a control element are mounted; and a housing member that houses the circuit substrate (see JP 2016-158373A).

The switching element connects and disconnects the connection between the power supply and the load. The control element performs control so as to turn the switching element on and off. When the switching element is on, an electric current flows from the power supply to the load through the switching element. When the switching element is off, an electric current does not flow through the switching element, and thus the connection between the power supply and the load is disconnected.

The switching element generates heat when energized. In particular, when an overcurrent flows through the switching element, the switching element overheats. The overheated switching element may catch fire.

However, a fusible link is provided on a conductor wire that connects the power supply or the load to the switching element. When an overcurrent flows through the conductor wire, the fusible link blows out. As a result, the overcurrent is prevented from flowing into the switching element, and thus the switching element is protected from overheating.

Also, when, for example, an electric current that exceeds an upper limit value that is smaller than the overcurrent flows through the switching element, or the temperature of the switching element exceeds an upper limit temperature that is lower than the overheating temperature, the control element turns off the switching element. As a result, the switching element is protected from overheating.

The inventors of the present disclosure assumed an accidental situation in which, for example, the fusible link does not blow out, and the control element does not perform overheat protection of the switching element due to a malfunction of the control element. In such an accidental situation, the switching element overheats and catches fire. Accordingly, a technical problem to be solved is to take measures to cope with an accidental situation.

Thus, it is an object of the present disclosure to provide an electrical junction box in which it is possible to prevent a switching element from catching fire.

SUMMARY

An electrical junction box according to one aspect of the present disclosure is an electrical junction box including: a circuit substrate on which a switching element is mounted on one side of the circuit substrate; and a housing member that houses the circuit substrate. The housing member further houses a thermally expandable expansion material member. When a temperature of the switching element is low, the expansion material member is spaced apart from the circuit substrate and the switching element, and is disposed at a position opposing the one side. When the temperature of the switching element is high, the switching element is embedded in the thermally expanded expansion material member.

Advantageous Effects of Disclosure

According to the above-described aspect of the present disclosure, it is possible to provide an electrical junction box in which it is possible to prevent a switching element from catching fire.

BRIEF DESCRIPTION OF DRAWINGS

FIG. 5 is an exploded perspective view of the cover, the expansion material member, and the like.

DETAILED DESCRIPTION OF PREFERRED EMBODIMENTS

Figure 1:
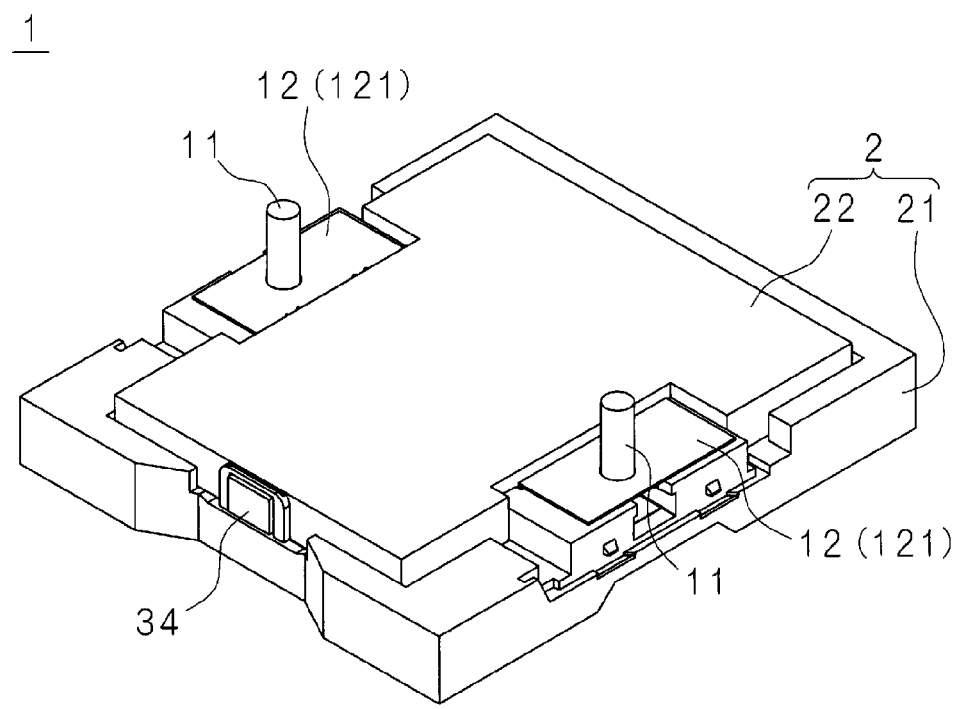
FIG. 1 is a perspective view of an electrical junction box according to one aspect of the present disclosure.

First, aspects according to the present disclosure are listed and described. Also, at least a portion of the embodiments described below may be combined in any way.

An electrical junction box according to one aspect of the present disclosure is an electrical junction box including: a circuit substrate on which a switching element is mounted on one side of the circuit substrate; and a housing member that houses the circuit substrate, wherein the housing member further houses a thermally expandable expansion material member, when a temperature of the switching element is low, the expansion material member is spaced apart from the circuit substrate and the switching element, and is disposed at a position opposing the one side, and when the temperature of the switching element is high, the switching element is embedded in the thermally expanded expansion material member.

According to this aspect, when the switching element overheats (hereinafter referred to as "when overheated"), the temperature of the switching element is high, and thus the expansion material member undergoes thermal expansion. The switching element is embedded in the thermally expanded expansion material member.

Accordingly, oxygen does not flow around the switching element. Thus, it is possible to prevent the switching element from catching fire.

It is also possible to prevent fine particles, a gas, or the like generated from the switching element when overheated from leaking out of the housing member.

When the switching element is not overheated (hereinafter referred to as "when not overheated"), the temperature of the switching element is low, and thus the expansion material member is spaced apart from the circuit substrate and the switching element. Accordingly, the expansion material member does not come into contact with the circuit substrate or the switching element when they are not overheated. Thus, even if the expansion material member is made of an electrically conductive material, it is possible to prevent a short circuit of the electric circuit caused by the expansion material member coming into contact with the circuit substrate or the switching element.

It is preferable that the housing member further houses a thermal conductor that transfers heat emitted from the switching element to the expansion material member.

According to this aspect, the heat emitted from the switching element is rapidly transferred to the expansion material member through the thermal conductor. Accordingly, the expansion material member can rapidly thermally expand during overheating.

It is preferable that the thermal conductor is in contact with a surface of the expansion material member that opposes the one side and an inner portion of the expansion material member.

According to this aspect, the heat emitted from the switching element is rapidly transferred to the surface and the inner portion of the expansion material member through the thermal conductor. Accordingly, the expansion material member can more rapidly thermally expand when overheated.

It is preferable that the thermal conductor also functions as a fixing member that fixes the expansion material member to the housing member.

According to this aspect, the fixing member and the thermal conductor are configured as a unitary body, and it is therefore possible to reduce the number of components.

It is preferable that a partition is provided within the housing member, the partition separating a space in which the switching element and the expansion material member are housed from a space in which the switching element and the expansion material member are not housed.

According to this aspect, the switching element and the expansion material member are housed within a space defined by the partition, and thus the switching element can be reliably embedded in the thermally expanded expansion material member.

A specific example of an electrical junction box according to an embodiment of the present disclosure will be described below with reference to the drawings. It is to be noted that the present disclosure is not limited to the examples given below, the scope of the present disclosure is indicated by the appended claims, and all changes that come within the meaning and range of equivalency of the claims are to be embraced within the scope of the present disclosure.

FIG. 1 is a perspective view of an electrical junction box according to one aspect of the present disclosure.

In the diagram, reference numeral 1 denotes an electrical junction box. The electrical junction box 1 is mounted on a vehicle. The electrical junction box 1 is provided in an electric circuit that connects a power supply (for example, a main battery (not shown)) and a first load (for example, a headlight or a windshield wiper (not shown)). The power supply is connected directly to a second load (for example, a starter (not shown)). The electrical junction box 1 is configured to, when a large current flows from the power supply to the second load, disconnect the connection between the power supply and the first load to protect the first load from the harmful influence of a large current.

The electrical junction box 1 includes a housing member 2. The housing member 2 includes a frame 21 and a cover 22.

Figure 2:
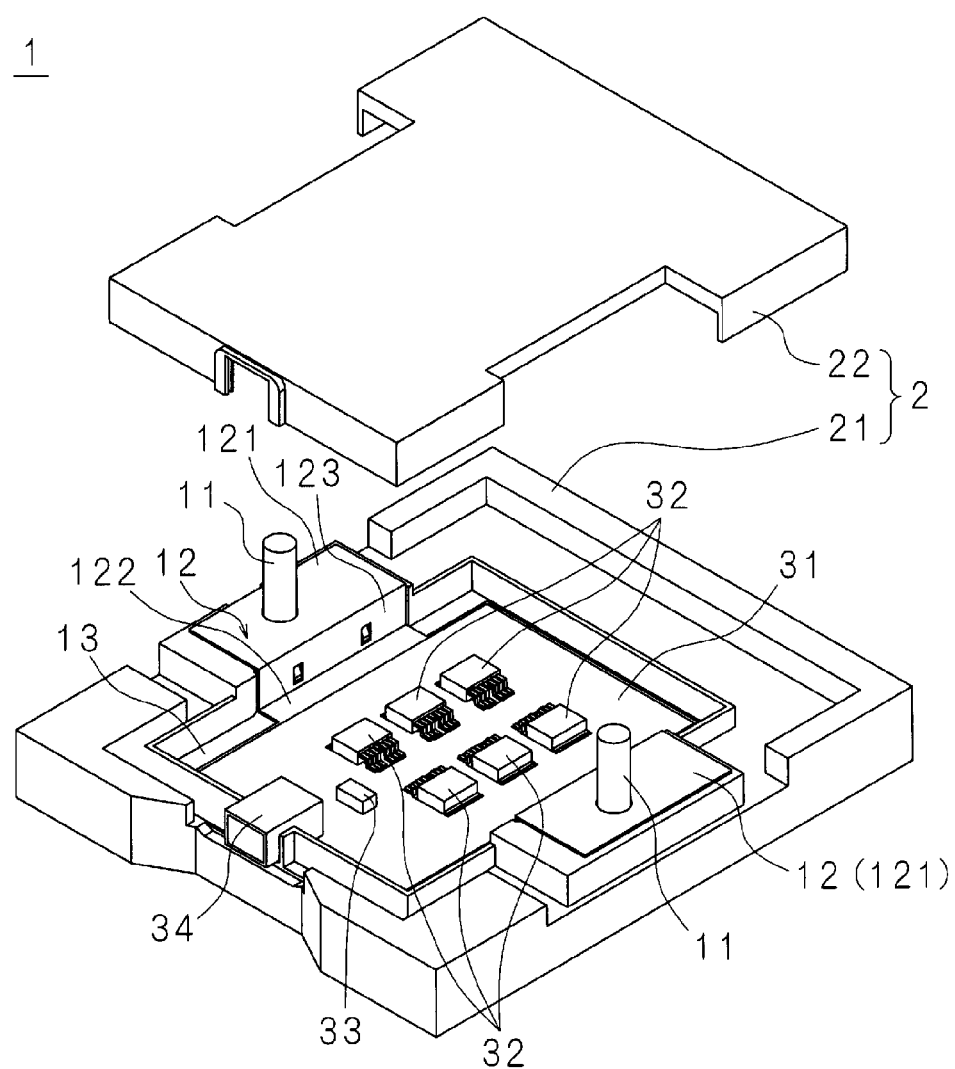
FIG. 2 is a perspective view of the electrical junction box in a state in which a cover has been removed from a frame of the electrical junction box.
Figure 3:
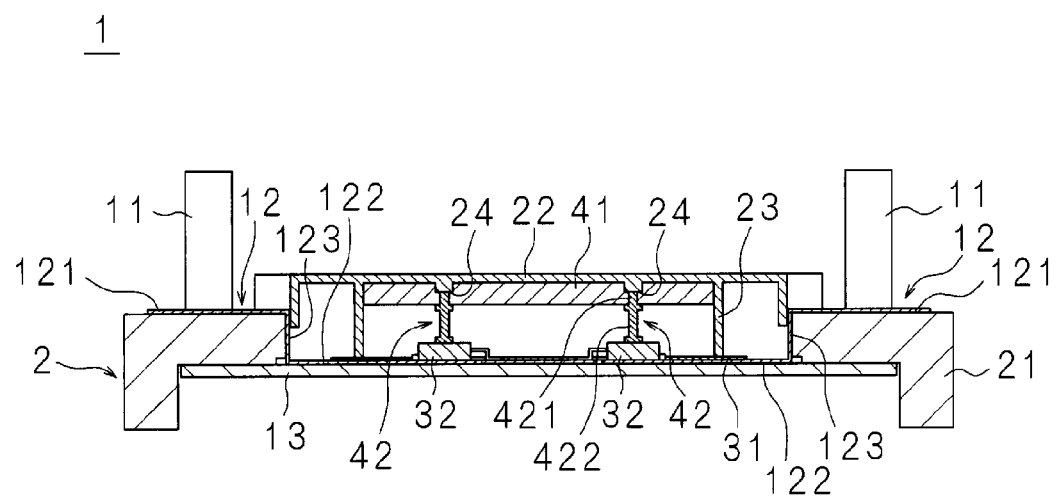
FIG. 3 is a cross-sectional view of the electrical junction box.

FIG. 2 is a perspective view of the electrical junction box 1 in a state in which the cover 22 has been removed from the frame 21. FIG. 3 is a cross-sectional view of the electrical junction box 1.

The frame 21 has a short rectangular tubular shape. The axial direction of the frame 21 corresponds to the up-down direction of the diagram.

The cover 22 has a rectangular dish shape. A partition 23 is provided protruding vertically from the inner surface of the bottom of the cover 22. The partition 23 has a rectangular tubular shape (see FIGS. 4 and 5, which will be described later). Six bosses 24 are provided protruding vertically from a portion surrounded by the partition 23 on the inner surface of the cover 22. The six bosses 24 are arranged in 3 rows and 2 columns (see FIGS. 4 and 5, which will be described later).

The housing member 2 is formed by the cover 22 closing one opening (upper opening in the diagram) of the frame 21. The partition 23 and the six bosses 24 of the cover 22 are provided within the housing member 2.

In the description given below, the up-down direction of the diagram corresponds to the up-down direction of the electrical junction box 1.

Two stud bolts 11 are provided protruding upward on the upper end surface of the frame 21. The two stud bolts 11 are provided at opposite positions across the upper opening of the frame 21. The cover 22 closes the opening of the frame 21 such that the row direction of the six bosses 24 extends along the direction in which the two stud bolts 11 oppose each other.

A bus bar 12 is attached to each stud bolt 11.

The bus bars 12 are electrically conductive. The bus bars 12 are each made of, for example, one metal plate bent into a Z shape. The bus bars 12 each include three rectangular flat plates 121 to 123. The rectangular flat plates 121 and 122 are respectively provided on two opposing sides of the rectangular flat plate 123 so as to protrude perpendicular thereto. The rectangular flat plates 121 and 122 protrude in opposite directions.

A through hole is formed in the rectangular flat plate 121. The stud bolt 11 is inserted into the through hole of the rectangular flat plate 121.

The rectangular flat plate 121 is placed on the upper end surface of the frame 21. The rectangular flat plate 123 extends along the inner peripheral surface of the frame 21. The rectangular flat plate 122 is provided flush with the lower end surface of the frame 21 so as to partially close the lower opening of the frame 21.

The bus bar 12 that is attached to one of the stud bolts 11 is connected to the power supply via a conductor wire (not shown). The bus bar 12 that is attached to the other stud bolt 11 is connected to the first load via another conductor wire (not shown). Each bus bar 12 and the corresponding conductor wire are connected by bringing the bus bar 12 and a connection terminal (not shown) attached to the conductor wire into contact with each other, and fastening them to the frame 21 using the stud bolt 11 and a nut (not shown).

A heat sink 13 is attached to the lower surfaces of the rectangular flat plates 122 of the bus bars 12.

The heat sink 13 has high thermal conductivity and is made of, for example, a metal. The heat sink 13 has a rectangular flat plate shape. The lower surfaces of the rectangular flat plates 122 of the bus bars 12 and the upper surface of the heat sink 13 are bonded with an adhesive (not shown) made of, for example, a thermosetting synthetic resin. When the adhesive has been cured, an adhesive layer (not shown) is formed between the bus bars 12 and the heat sink 13. The adhesive layer has electrical insulation properties, and thus does not prevent the transfer of heat from the bus bars 12 to the heat sink 13.

The heat sink 13 attached to the two bus bars 12 covers the lower end surface of the frame 21 and closes the lower opening of the frame 21. As a result, the frame 21 and the heat sink 13 form a box in which the frame 21 serves as the peripheral wall and the heat sink 13 serves as the bottom.

A heat dissipation fin may be provided on the lower surface of the heat sink 13.

The electrical junction box 1 further includes a circuit substrate 31.

The circuit substrate 31 is attached to the upper surfaces of the rectangular flat plates 122 of the bus bars 12, with one side facing downward.

On the upper surface of the circuit substrate 31, six switching elements 32 and a control element 33 are mounted.

Each of the six switching elements 32 is, for example, an FET (Field Effect Transistor). The six switching elements 32 are grouped into pairs. In each pair of switching elements 32, for example, the source terminals are connected to each other. In this case, the drain terminals of the switching elements 32 that are paired are connected to different bus bars 12. The gate terminals of the switching elements 32 are connected to the control element 33.

Each pair of switching elements 32 is provided in a direction in which the two stud bolts 11 oppose each other (or in other words, the row direction of the six bosses 24 of the cover 22), and three pairs of switching elements 32 are provided in the column direction of the six bosses 24 of the cover 22. When the cover 22 is closed, the six switching elements 32 and the six bosses 24 face each other in the up-down direction.

When all of the switching elements 32 are on, the two bus bars 12 are connected to each other. At this time, an electric current flows from the power supply to the first load via the three pairs of switching elements 32.

The electric current that flows through each pair of switching elements 32 is ⅓ of the electric current that flows through the bus bars 12. That is, by using the three pairs of switching elements 32, the electric current that flows through each switching element 32 can be reduced.

When all of the switching elements 32 are off, an electric current does not flow through the switching elements 32, and thus the connection between the two bus bars 12 is disconnected. At this time, the connection between the power supply and the first load is disconnected. When the connection between the power supply and the first load is disconnected, the first load receives a supply of power from an auxiliary power supply (for example, a sub-battery (not shown)) that is connected directly to the first load.

In each pair of switching elements 32, the forward direction of a parasitic diode provided in one of the switching elements 32 and the forward direction of a parasitic diode provided in the other switching element 32 are opposite to each other. Accordingly, when all of the switching elements 32 are off, a situation does not occur in which the two bus bars 12 are connected via the parasitic diodes of the six switching elements 32.

The switching elements 32 are not limited to FETs. The switching elements 32 do not necessarily need to be paired. It is sufficient that at least one switching element 32 is provided between the two bus bars 12.

The control element 33 is, for example, an MPU (Micro Processing Unit). The control element 33 is connected to a connector 34. The connector 34 is provided in the peripheral edge portion of the circuit substrate 31. A control signal is input to the control element 33 from the outside of the electrical junction box 1 via a signal line (not shown) that is connected to the connector 34.

The control element 33 turns on and off the switching elements 32 according to the input control signal. For example, if a control signal indicating to start operations of the starter is input, the control element 33 turns off all of the switching elements 32. After the engine has been started by the starter, the control element 33 turns on all of the switching elements 32.

The electrical junction box 1 further includes a temperature sensor (not shown). The temperature sensor detects the temperatures of the six switching elements 32. The result of temperature detection performed by the temperature sensor is given to the control element 33.

The control element 33 turns off all of the switching elements 32 if the temperature of the six switching elements 32 (or in other words, the temperature detected by the temperature sensor) exceeds a predetermined upper limit temperature. As used herein, the predetermined upper limit temperature refers to a temperature that is lower than the overheating temperature of the six switching elements 32.

That is, the control element 33 protects the six switching elements 32 from overheating.

When the six switching elements 32 are turned off based on the temperature of the six switching elements 32, the control element 33 keeps the six switching elements 32 off until the temperature of at least the six switching elements 32 falls below a predetermined safe temperature. As used herein, the predetermined safe temperature refers to a temperature that is sufficiently lower than the predetermined upper limit temperature.

The electrical junction box 1 may include an electric current sensor. The electric current sensor detects an electric current flowing through the switching elements 32. The control element 33 turns off the switching elements 32 when, for example, an electric current that exceeds an upper limit value that is smaller than an overcurrent flows through the switching elements 32.

That is, the control element 33 protects the six switching elements 32 from overheating by protecting the six switching elements 32 from an overcurrent.

The electrical junction box 1 further includes an expansion material member 41 and six fixing members 42.

Figure 4:
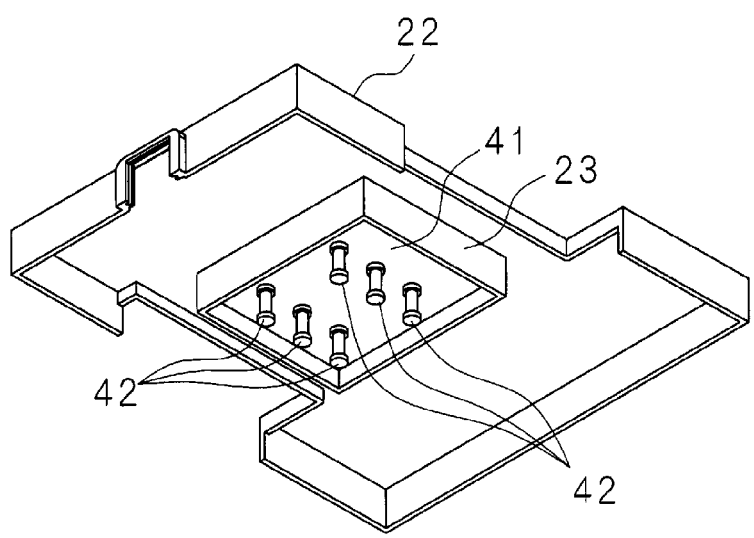
FIG. 4 is a perspective view of a cover, an expansion material member, and the like of the electrical junction box.
Figure 5:
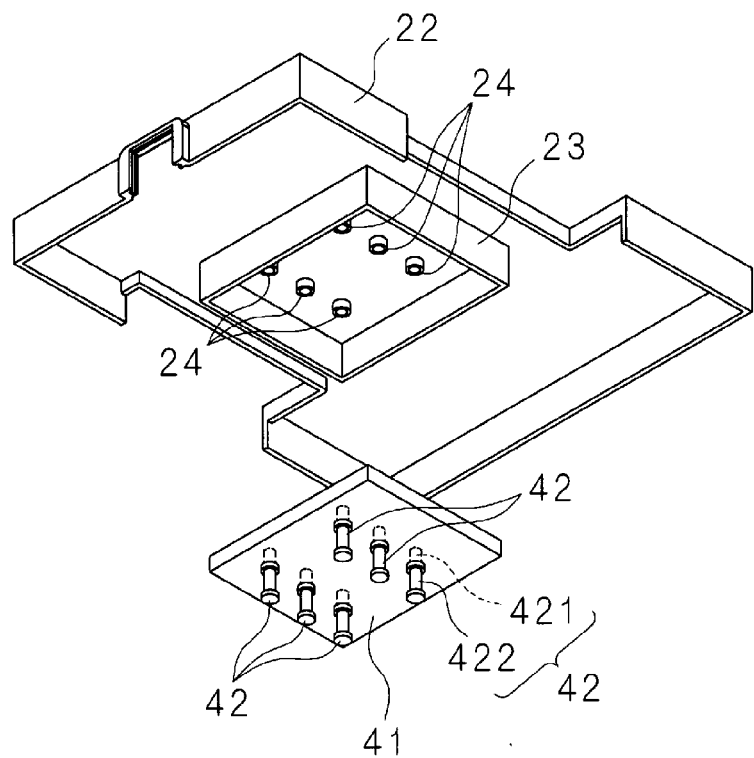

FIG. 4 is a perspective view of the cover 22, the expansion material member 41, and the like of the electrical junction box 1. FIG. 5 is an exploded perspective view of the cover 22, the expansion material member 41, and the like.

The expansion material member 41 contains, for example, graphite and a synthetic rubber, and is thermally expandable, flame resistant, and electrically conductive. As a material of the expansion material member 41, for example, the fireproof expandable resin composition disclosed in JP H9-176498A may be used.

The expansion material member 41 thermally expands abruptly when exposed to a temperature greater than or equal to a predetermined temperature. In the present embodiment, the predetermined temperature at which the expansion material member 41 starts abrupt thermal expansion is the same as the overheating temperature (for example, 250° C. to 300° C.) of the six switching elements 32.

The expansion material member 41 does not necessarily need to be electrically conductive.

The expansion material member 41 has a rectangular sheet shape or a rectangular plate shape. The expansion material member 41 is fitted into the portion surrounded by the partition 23 such that the upper surface of the expansion material member 41 is in contact with the inner surface of the cover 22. At this time, the six bosses 24 are embedded in the expansion material member 41 from the upper surface of the expansion material member 41.

The fixing members 42 are thermal conductors. The fixing members 42 have flame resistance and high thermal conductivity. The fixing members 42 are made of, for example, a metal. Each fixing member 42 includes a fixing portion 421 and a heat conducting portion 422.

The fixing portion 421 is a stud that includes a head portion and a leg portion protruding from the head portion. The heat conducting portion 422 has a stud-like shape that includes a head portion and a leg portion protruding from the head portion. The head portion of the fixing portion 421 and the head portion of the heat conducting portion 422 are disc-shaped. The leg portion of the fixing portion 421 and the leg portion of the heat conducting portion 422 have round columnar shapes that are coaxial with each other. The leg portion of the heat conducting portion 422 is interposed between the head portion of the fixing portion 421 and the head portion of the heat conducting portion 422.

The leg portion of each fixing portion 421 is embedded in the expansion material member 41 from the lower surface of the expansion material member 41. The leading end portion of the leg portion of the fixing portion 421 embedded in the expansion material member 41 is fitted into the boss 24. As a result, the expansion material member 41 is sandwiched between the head portions of the fixing portions 421 and the cover 22. Accordingly, the expansion material member 41 is fixed to the cover 22.

The head portions of the fixing portions 421 are in contact with the lower surface (the surface of the expansion material member 41) of the expansion material member 41. A portion of each leg portion of the fixing portions 421 that is not embedded in the boss 24 is in contact with the inner portion of the expansion material member 41.

Each fixing portion 421 may have a male thread, and each boss 24 may have a female thread.

As shown in FIGS. 1 and 3, when the cover 22 is closed, the rectangular flat plates 122 and 123 of the bus bars 12, the circuit substrate 31, the six switching elements 32, the control element 33, the connector 34, the expansion material member 41, and the fixing members 42 are housed in the housing member 2. However, a cut-out recess portion is formed in the peripheral wall of the cover 22, and thus a portion of (specifically, a portion of the connector 34 to which the above-described signal line is connected) of the connector 34 is exposed to the outside of the housing member 2 from the opening formed by the recess portion and the frame 21. The two stud bolts 11, the rectangular flat plates 121 of the bus bars 12, and the heat sink 13 are exposed to the outside of the housing member 2.

The upper surface of the circuit substrate 31 and the expansion material member 41 are disposed at opposing positions. The circuit substrate 31 and the six switching elements 32 are disposed spaced apart from the expansion material member 41. Accordingly, the expansion material member 41 does not come into contact with the circuit substrate 31 and the switching elements 32. Thus, it is possible to prevent a short circuit of the electric circuit caused by the expansion material member 41 coming into contact with the circuit substrate 31 or the switching elements 32.

The leading end surface of the partition 23 comes into contact with the upper surface of the circuit substrate 31.

The six switching elements 32 and the expansion material member 41 are housed in a space surrounded by the circuit substrate 31, the cover 22, and the partition 23. In other words, the partition 23 separates a space in which the six switching elements 32 and the expansion material member 41 are housed from a space in which the six switching elements 32 and the expansion material member 41 are not housed.

The head portion of the heat conducting portion 422 of each fixing member 42 comes into contact with a non-conductive portion of a switching element 32.

In the electrical junction box 1 configured as described above, the switching elements 32 generate heat when energized. The heat emitted from the switching elements 32 is transmitted to the circuit substrate 31, the bus bars 12, and the heat sink 13, and then discharged from the heat sink 13 to the outside of the electrical junction box 1.

When not overheated, the temperature of the switching elements 32 is low.

Here, overheating will be described.

The switching elements 32 may overheat in an accidental situation in which the control element 33 malfunctions and does not perform overheat protection of the switching elements 32.

When overheated, the temperature of the switching elements 32 is high.

The heat emitted from the switching elements 32 is transferred to the surface of the expansion material member 41 by, for example, air convection between the circuit substrate 31 and the expansion material member 41. Furthermore, the heat emitted from the switching elements 32 is rapidly transferred to the surface and the inner portion of the expansion material member 41 through the fixing members 42. As a result, when overheating occurs, the expansion material member 41 rapidly undergoes thermal expansion.

Figure 6:
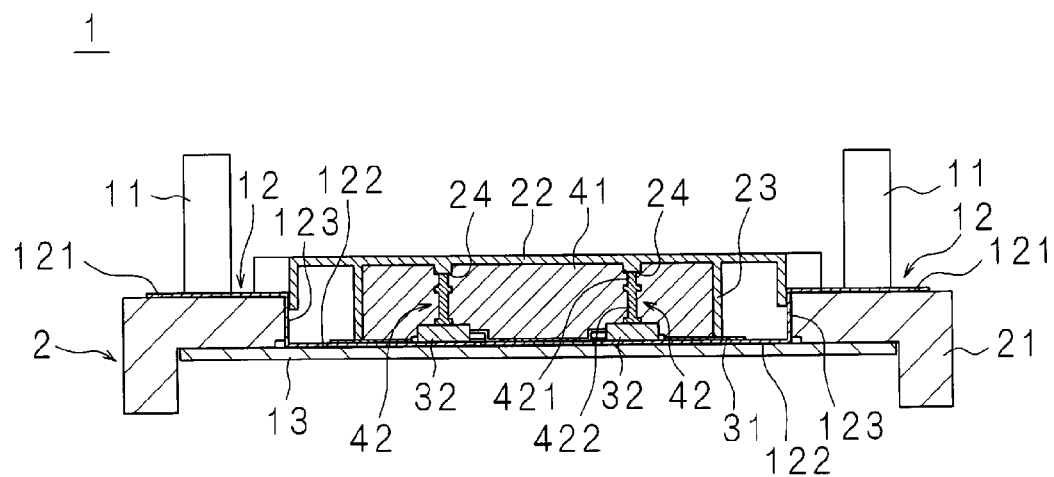
FIG. 6 is a diagram illustrating a state in which the expansion material member has thermally expanded.

FIG. 6 is a diagram illustrating a state in which the expansion material member 41 of the electrical junction box 1 has thermally expanded.

The cover 22 prevents the expansion material member 41 from thermally expanding in a direction away from the circuit substrate 31 and the switching elements 32. The partition 23 guides the thermally expanded expansion material member 41 in a direction approaching the circuit substrate 31 and the switching elements 32. Accordingly, the thermally expanded expansion material member 41 covers the switching elements 32 from above such that the expansion material member 41 and the circuit substrate 31 close the space around the switching elements 32. In this way, the switching elements 32 are reliably embedded in the thermally expanded expansion material member 41.

Accordingly, oxygen does not flow around the switching elements 32. It is therefore possible to prevent the switching elements 32 from catching fire.

It is also possible to prevent fine particles, a noxious gas or the like generated from the switching elements 32 when overheated from leaking out of the housing member 2.

If the electric circuit short circuits due to the thermally expanded expansion material member 41 coming into contact with the circuit substrate 31 or the switching elements 32, an overcurrent will flow through the above-described conductor wire. At this time, the fusible link (not shown)

provided on the conductor wire blows out, and thus the power supply and the load are protected from the overcurrent.

The use of the fixing members 42 is advantageous in that it is possible to reduce the number of components. However, a member that fixes the expansion material member 41 to the housing member 2 and a thermal conductor that transfers heat emitted from the switching elements 32 to the expansion material member 41 may be provided separately.

The electrical junction box 1 is not limited to a vehicle-mounted electrical junction box. The electrical junction box 1 may be configured to selectively distribute power from a power supply to a plurality of loads.

The invention claimed is:

1. An electrical junction box comprising:
a circuit substrate on which a switching element is mounted on one side of the circuit substrate; and
a housing member that houses the circuit substrate,
wherein the housing member further houses a thermally expandable expansion material member,
when a temperature of the switching element is low, the expansion material member is spaced apart from the circuit substrate and the switching element, and is disposed at a position opposing the one side, and
when the temperature of the switching element is high, the switching element is embedded in the thermally expanded expansion material member, wherein the housing member further houses a fixing member that transfers heat emitted from the switching element to the expansion material member.

2. The electrical junction box according to claim 1, wherein the fixing member is in contact with a surface of the expansion material member that opposes the one side and an inner portion of the expansion material member.

3. The electrical junction box according to claim 1, wherein the fixing member fixes the expansion material member to the housing member.

4. The electrical junction box according to claim 1, wherein, a partition is provided within the housing member, the partition separating a space in which the switching element and the expansion material member are housed from a space in which the switching element and the expansion material member are not housed.

5. The electrical junction box according to claim 2, wherein, a partition is provided within the housing member, the partition separating a space in which the switching element and the expansion material member are housed from a space in which the switching element and the expansion material member are not housed.

6. The electrical junction box according to claim 3, wherein, a partition is provided within the housing member, the partition separating a space in which the switching element and the expansion material member are housed from a space in which the switching element and the expansion material member are not housed.

* * * * *